United States Patent
Teranishi et al.

(10) Patent No.: US 10,256,383 B2
(45) Date of Patent: Apr. 9, 2019

(54) LIGHT EMITTING DEVICE WITH DARK AREA AND GREATER REFLECTANCE LIGHT AREA, DISPLAY UNIT, AND IMAGE DISPLAY DEVICE

(71) Applicant: MITSUBISHI ELECTRIC CORPORATION, Chiyoda-ku, Tokyo (JP)

(72) Inventors: Masato Teranishi, Tokyo (JP); Satoru Kiridoshi, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/562,685

(22) PCT Filed: Jun. 1, 2015

(86) PCT No.: PCT/JP2015/065824
§ 371 (c)(1),
(2) Date: Sep. 28, 2017

(87) PCT Pub. No.: WO2016/194120
PCT Pub. Date: Dec. 8, 2016

(65) Prior Publication Data
US 2018/0097159 A1    Apr. 5, 2018

(51) Int. Cl.
*H01L 33/60* (2010.01)
*G09F 9/33* (2006.01)
(Continued)

(52) U.S. Cl.
CPC .............. *H01L 33/60* (2013.01); *G09F 9/33* (2013.01); *H01L 27/156* (2013.01);
(Continued)

(58) Field of Classification Search
CPC ................................ H01L 33/60; H01L 33/56
See application file for complete search history.

(56) References Cited

U.S. PATENT DOCUMENTS 8,785,525 B2    7/2014  Kotani et al.
2003/0025117 A1  2/2003  Isokawa et al.
(Continued)

FOREIGN PATENT DOCUMENTS

CN    104566230 A    4/2015
JP    10-215001 A    8/1998
(Continued)

OTHER PUBLICATIONS

English translation of JP 2013168426 published Aug. 29, 2013 to Yamamoto et al.*
(Continued)

*Primary Examiner* — Asok K Sarkar
*Assistant Examiner* — Grant S Withers
(74) *Attorney, Agent, or Firm* — Buchanan Ingersoll & Rooney PC

(57) ABSTRACT

A light emitting device includes an LED chip to emit light, and a light emitting element holding member that includes a base on which the LED chip is disposed and a wall standing from the base such that the wall has an inner surface that faces the LED chip. The wall includes inner surfaces that are formed in black, and inner surfaces that are formed in white. The inner surfaces that are formed in black mutually oppose each other. The inner surfaces that are formed in white mutually oppose each other in a direction orthogonal to the direction in which the inner surfaces that are formed in black mutually oppose each other.

9 Claims, 13 Drawing Sheets

(51) Int. Cl.
   *H01L 27/15* (2006.01)
   *H01L 33/48* (2010.01)
(52) U.S. Cl.
   CPC .. *H01L 33/483* (2013.01); *H01L 2224/48091* (2013.01); *H01L 2224/48227* (2013.01)

(56) References Cited

U.S. PATENT DOCUMENTS

| | | | |
|---|---|---|---|
| 2012/0273811 A1* | 11/2012 | Krauter | ............... H01L 31/0203 257/88 |
| 2012/0280116 A1 | 11/2012 | Krauter et al. | |
| 2014/0048827 A1 | 2/2014 | Inoue et al. | |
| 2015/0252258 A1 | 9/2015 | Konishi | |
| 2016/0252722 A1 | 9/2016 | Li et al. | |

FOREIGN PATENT DOCUMENTS

| | | | |
|---|---|---|---|
| JP | H10-284759 | A | 10/1998 |
| JP | 2000-299502 | A | 10/2000 |
| JP | 2003-17755 | A | 1/2003 |
| JP | 2003-282955 | A | 10/2003 |
| JP | 2004-288936 | A | 10/2004 |
| JP | 2007-067190 | A | 3/2007 |
| JP | 2007-286412 | A | 11/2007 |
| JP | 2007-300018 | A | 11/2007 |
| JP | 2010-171130 | A | 8/2010 |
| JP | 2011-138849 | A | 7/2011 |
| JP | 2013-514641 | A | 4/2013 |
| JP | 2013-168426 | A | 8/2013 |
| JP | 5744338 | B2 | 7/2015 |
| TW | 401205 | U1 | 4/2011 |

OTHER PUBLICATIONS

International Search Report (PCT/ISA/210) dated Jul. 7, 2015, by the Japanese Patent Office as the International Searching Authority for International Application No. PCT/JP2015/065824.
Written Opinion (PCT/ISA/237) dated Jul. 7, 2015, by the Japanese Patent Office as the International Searching Authority for International Application No. PCT/JP2015/065824.
Office Action dated May 24, 2016 by the Taiwanese Patent Office for Application No. 10520629970.
Office Action (Notification of Reasons for Refusal) dated Dec. 19, 2017, by the Japanese Patent Office in corresponding Japanese Patent Application No. 2017-521379 and English translation of the Office Action. (9 pages).
Office Action (Notification of Reasons for Refusal) dated Jul. 10, 2018, in corresponding Japanese Patent Application No. 2017-521379 and English translation of the Office Action.
Extended European Search Report dated Nov. 20, 2018 in corresponding European Patent Application No. 15894155.9.

* cited by examiner

LIGHT EMITTING DEVICE WITH DARK AREA AND GREATER REFLECTANCE LIGHT AREA, DISPLAY UNIT, AND IMAGE DISPLAY DEVICE

TECHNICAL FIELD

The present disclosure relates to a light emitting device, a display unit, and a video display device.

BACKGROUND ART

A video display device that displays video is divided into numerous display units. The display units each include light emitting devices arranged in a matrix on a circuit substrate. In the light emitting device, an LED chip is mounted on a bottom surface of a concavity formed in a package, and further, a sealing member that is translucent with respect to light emitted from the LED chip is used to seal the concavity.

As indicated in Patent Literature 1, a light emitting device formed in a black resin package is known. This is made with the intention of achieving a high-contrast display (refer to paragraph 0016 of Patent Literature 1).

CITATION LIST

Patent Literature

Patent Literature 1: Unexamined Japanese Patent Application Kokai Publication No. 2003-17755

SUMMARY OF INVENTION

Technical Problem

In order to achieve a video display device that is readily visible, the individual light emitting devices must have a high luminance. In the light emitting device disclosed in Patent Literature 1, high illuminance cannot be achieved because light emitted from the LED chip is attenuated by a black package.

An objective of the present disclosure is to provide a light emitting device, a display unit, and a video display device that can suppress reflections or scattering of incident light from the outside and can suppress loss of light that is emitted from a light emitting element.

Solution to Problem

In order to achieve the aforementioned objective, a light emitting device of the present disclosure includes at least one light emitting element to emit light; and a light emitting element holding member that includes a base on which the light emitting element is disposed and a wall standing from the base such that the wall has an inner surface that faces the light emitting element, wherein the inner surface of the wall includes a first area that is formed in a dark color, and a second area having a reflectance that is greater than that of the first area with respect to the light emitted by the light emitting element.

Advantageous Effects of Invention

Since the inner surface of the wall of the light emitting element holding member includes the first area formed in a dark color, reflections or scattering of incident light from the outside is unlikely. Furthermore, since the inner surface of the wall of the light emitting element holding member also includes the second area with a relatively high reflectance, loss of light emitted from the light emitting element is unlikely.

DESCRIPTION OF EMBODIMENTS

Next, a light emitting device, a display unit, and a video display device according to embodiments of the present disclosure are described with reference to the drawings. The same reference signs are used for the same or equivalent parts throughout the drawings.

Figure 1:
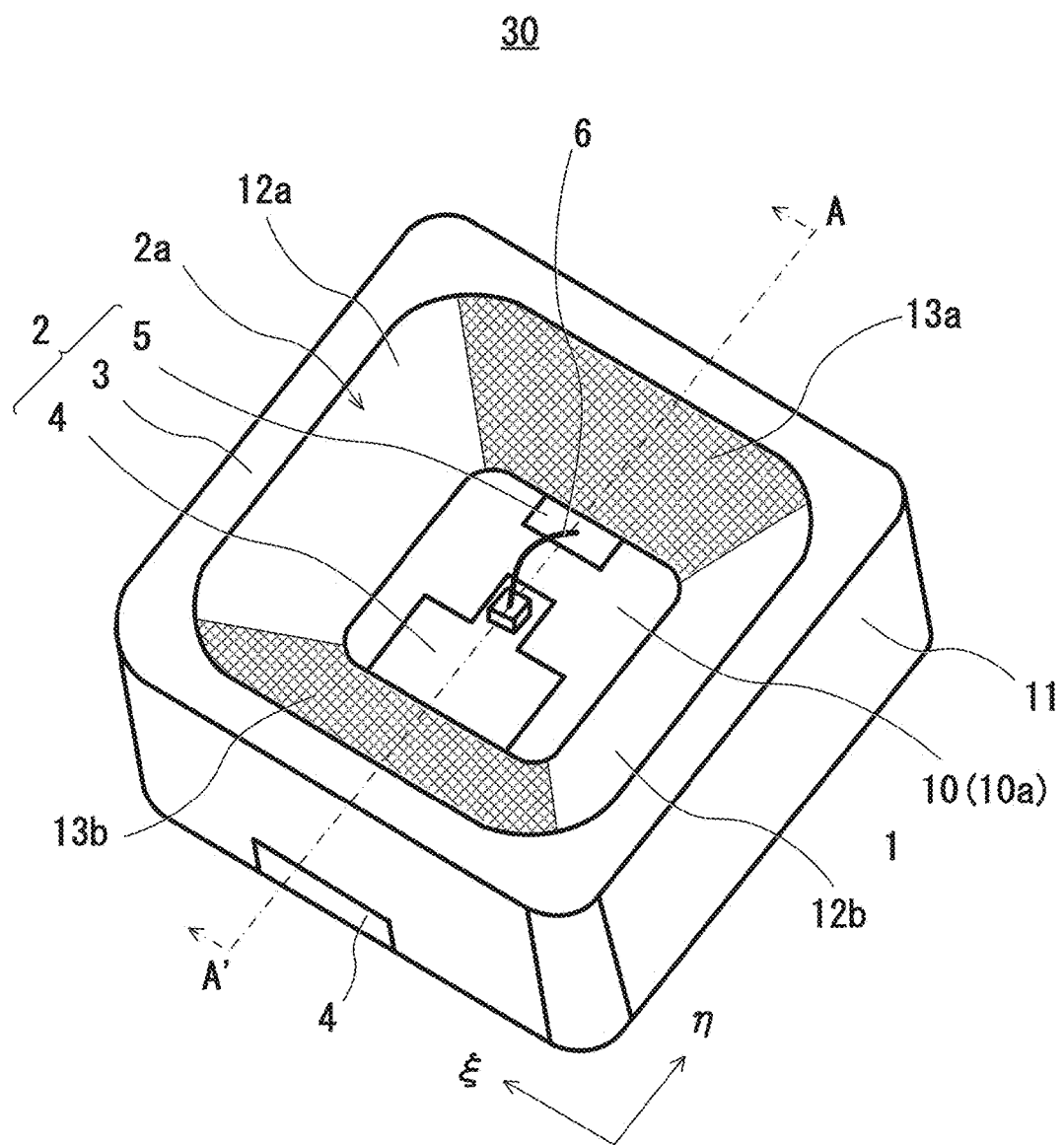
FIG. 1 is a perspective view of a light emitting device according to an embodiment.
Figure 2:
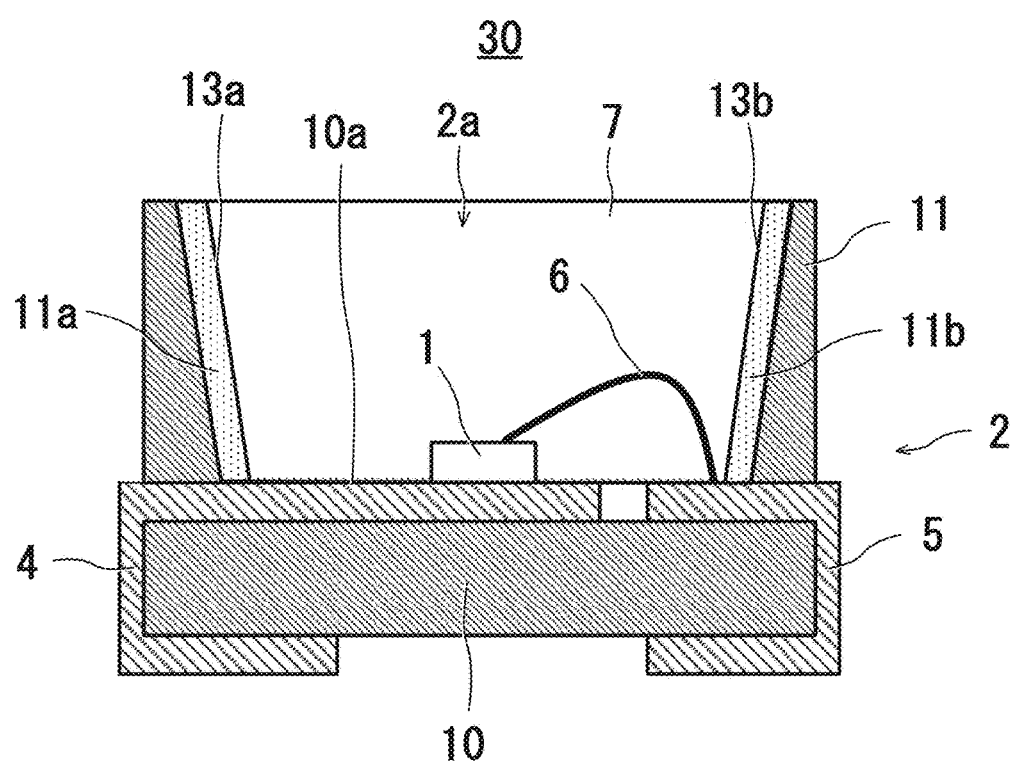
FIG. 2 is a cross-sectional view sectioned along A-A' line in FIG. 1.

A light emitting device 30 according to an embodiment of the present disclosure, as illustrated in FIGS. 1 and 2, includes a light emitting diode (LED) chip 1 as a light emitting element, a package 2 in which a concavity 2a is formed that houses the LED chip 1, and a sealing member 7 filled into the concavity 2a of the package 2. In order to facilitate understanding, the sealing member 7 is not illustrated in FIG. 1.

The package 2 includes a molded body 3, and a first lead frame 4 and a second lead frame 5 that are attached to the molded body 3.

The molded body 3 includes a flat base 10 on which the LED chip 1 is disposed, and a wall 11 that stands from the sheet base 10 such that the wall 11 has an inner circumferential surface surrounding the entirety of the LED chip 1. The concavity 2a is defined by the sheet base 10 and the wall 11.

One end of the first lead frame 4 and one end of the second lead frame 5 are exposed to a bottom surface 10a of the concavity 2a. The first lead frame 4 includes an anode electrode, whereas the second lead frame 5 includes a cathode electrode. The other end of the first lead frame 4 and the other end of the second lead frame 5 are also exposed to the outer surface of the package 2.

The LED chip 1 is substantially cuboid, and includes an anode electrode on the bottom surface thereof and a cathode electrode on the upper surface thereof. The LED chip 1 is mounted on the first lead frame 4, and the first lead frame 4 and the anode electrode on the bottom surface of the LED chip 1 are electrically connected together. The cathode electrode on the upper surface of the LED chip 1 is electrically connected to the second lead frame 5 by a bonding wire 6.

The shape of the opening of the concavity 2a in planar view is substantially square. The shape of the bottom surface 10a of the concavity 2a in planar view is also substantially square. However, the wall 11, from the opening of the concavity 2a, is inclined such that the wall 11 gets closer to the LED chip 1 as the wall 11 approaches the bottom surface 10a. Therefore, the concavity 2a is substantially in the shape of an upside-down truncated square pyramid. Here the term "truncated pyramid" refers a portion that remains after the pyramid upper tip including the apex has been sliced off by a plane substantially parallel to the bottom surface of the pyramid base.

The bottom surface 10a of the concavity 2a is black in the areas other than the first lead frame 4 and the second lead frame 5. Also, the surface of the first lead frame 4 and the surface of the second lead frame 5 that are exposed to the bottom surface 10a of the concavity 2a are also black.

Also black is a pair of mutually opposed surfaces 12a and 12b constituting portions of the inner circumferential surface of the wall 11. To facilitate understanding, as illustrated in FIG. 1, $\xi\eta$ orthogonal coordinates are used in which a direction parallel with one side of the bottom surface 10a of the concavity 2a that is substantially square in planar view, is defined as $\xi$ direction, and a direction parallel with another side adjacent to the one side is defined as $\eta$ direction. The surfaces 12a and 12b, which are black, oppose each other in the $\xi$ direction.

Conversely, the surfaces 13a and 13b on the inner circumferential surface of the wall 11 that are mutually opposing each other in the $\eta$ direction are white. In FIG. 1, to facilitate understanding, the shaded portions depict the white areas (the same is true for FIGS. 3, 7, 8A, 8B, 9 described further below). The white surfaces 13a and 13b have a greater reflectance than the black surfaces 10a, 12a, and 12b, with respect to light emitted from the LED chip 1. The white surfaces 13a and 13b are respectively constructed of thin white sheets 11a and 11b of the wall 11 of the molded body 3, as illustrated in FIG. 2 that is the cross-sectional view sectioned along A-A' line in FIG. 1.

Figure 3:
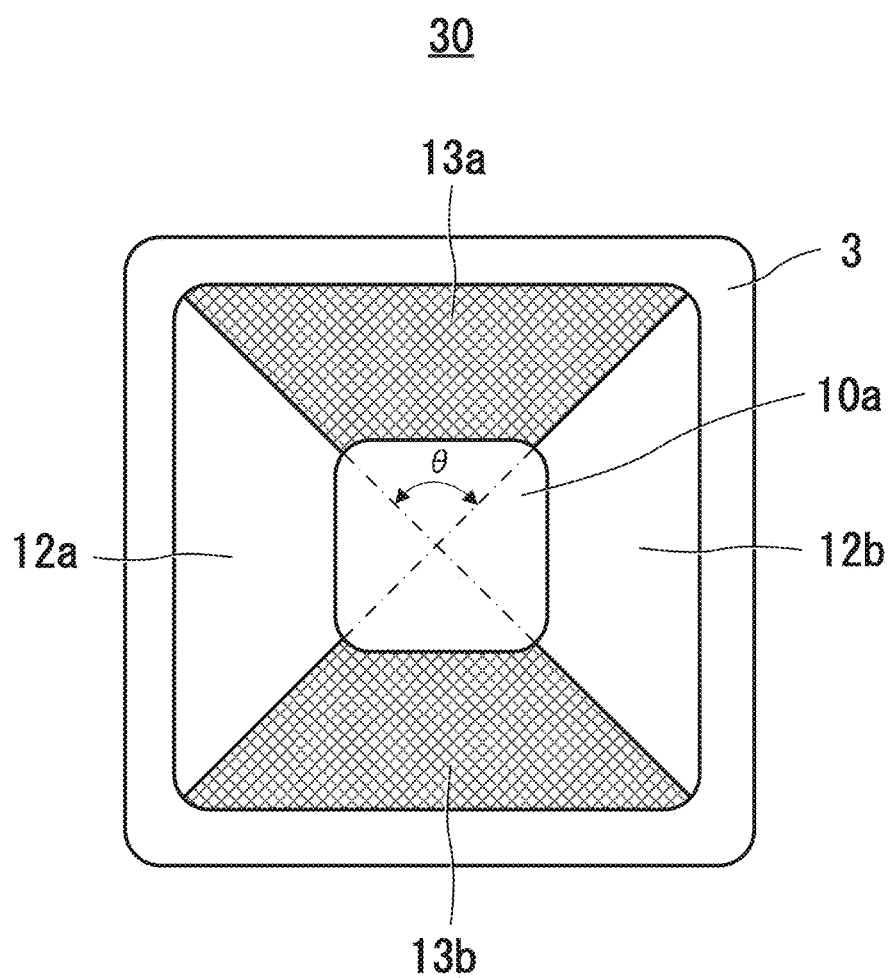
FIG. 3 is a plan view of the light emitting device illustrated in FIG. 1.

As illustrated in FIG. 3, in planar view of the light emitting device 30, the boundaries of the black surfaces 12a and 12b and the white surfaces 13a and 13b are defined by positions of imaginary lines obtained by extending two diagonal lines intersecting the square-shaped bottom surface 10a. In the current embodiment, the bottom surface 10a and the opening of the concavity 2a are both substantially regular quadrilaterals and the angle θ at which the diagonal lines intersect with each other is 90°. Thus, the surface areas of the black surfaces 12a and 12b are equal to the surface areas of the white surfaces 13a and 13b. To facilitate understanding, the lead frames 4 and 5, the bonding wire 6, and the LED chip 1 are not illustrated in FIG. 3.

Next, a manufacturing method of the light emitting device 30 is described. In the description below, the portion of the molded body 3 excluding the thin white sheets 11a and 11b illustrated in FIG. 2 is referred to as the main body portion.

First, a black resin melt is prepared by dispersing carbon black, as a dark colorant, into an epoxy resin, as a base material, that is heated and melted.

Here, the dark colorant refers to a material that has a lightness that is less than that of the base material. Here, although the carbon black is used as the dark colorant, other dark colorants such as inorganic oxides like chromium oxide, manganese oxide, and iron oxide may also be used. Also, although the epoxy resin is used here as the base material, other resins such as a phenolic resin, a polyimide resin, polyphthalamide, and the like may also be used.

Next, the aforementioned black resin melt is injected into a mold in which the first lead frame 4 and the second lead frame 5 have been pre-inserted. Upon removal from the mold after the injected black resin has hardened, an intermediary formed body is obtained in which the first lead frame 4 and the second lead frame 5 are integrated with the main body portion of the molded body 3.

Conversely, a white resin melt is prepared by dispersing titanium oxide, as a light colorant, into epoxy resin, as a base material. The thin white sheets 11a and 11b are formed by press-forming the white resin into thin sheets substantially trapezoidal in shape.

Here, the light colorant refers to a material having a greater lightness than the base material. Here, although the titanium oxide is used as the light colorant, other materials such as zinc oxide and the like may be used.

Next, the package 2 is completed by bonding the aforementioned thin white sheets 11a and 11b to the aforementioned intermediary formed body.

Next, the LED chip 1 is disposed on the first lead frame 4 such that both are electrically coupled together. Also, the electrode on the top surface of the LED chip 1 is electrically connected to the second lead frame 5 by the bonding wire 6.

Next, a black ink, as the dark colorant, is applied to the surfaces of the first lead frame 4 and the second lead frame 5. Here, the dark colorant refers to paint having a lightness that is less than that of a bottom layer, that is, conductive plates constituting the lead frames 4 and 5. The aforementioned black resin may be used as the dark colorant.

Next, the concavity 2a is filled with a silicone resin, as a light-transmitting material that has light-transmitting characteristics with respect to light emitted from the LED chip 1 to form the sealing member 7. After undergoing the aforementioned process, the light emitting device 30 is completed.

With the aforementioned light emitting device 30, even if outside light enters the light emitting device 30, since the surfaces 12a and 12b of the inner circumferential surface and the bottom surface 10a of the concavity 2a are black, the outside light can be suppressed by the black surfaces 10a, 12a, and 12b. Thus, the outside light is unlikely to be reflected or scattered.

Here, the outside light refers to light that enters the light emitting device 30 from outside of the light emitting device 30, and the outside light includes sunlight, illumination lighting, and the like.

Conversely, the surfaces 13a and 13b of the inner circumferential surface of the concavity 2a are white. The white surfaces 13a and 13b have a reflectance with respect to light emitted from the LED chip 1 that is greater than that of the black surfaces 10a, 12a, and 12b. Thus, the light emitted from the LED chip 1 is reflected to the outside by the surfaces 13a and 13b with minimal attenuation. Therefore, loss of light that is emitted by the LED chip 1 is unlikely.

Next, a display unit 300 provided with multiple aforementioned light emitting devices 30, and a video display device 500 provided with multiple display units 300 are described with reference to FIG. 4A, FIG. 4B, and FIG. 5.

Figure 4A:
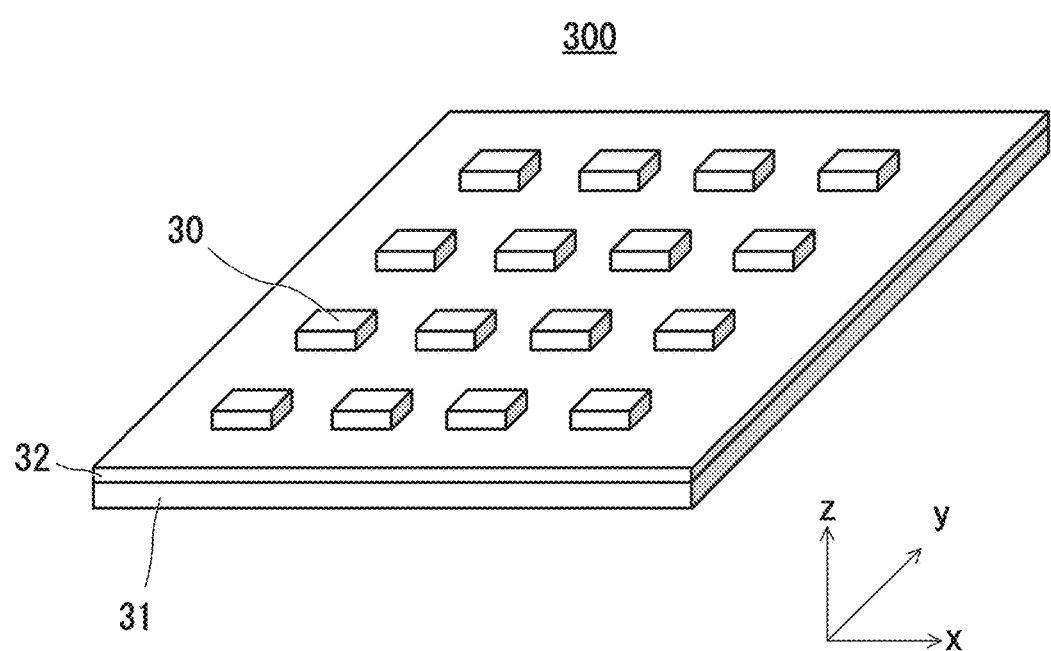
FIG. 4A is a perspective view of an display unit according to the embodiment.
Figure 4B:
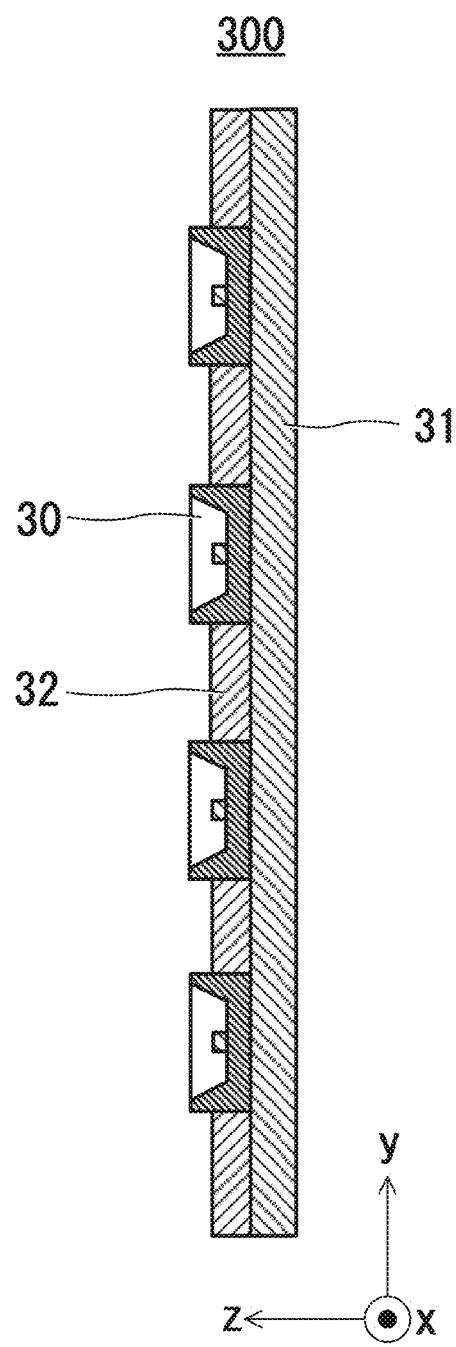
FIG. 4B is a cross-sectional view parallel to YZ plane of the display unit according to the embodiment.

The display unit 300, as illustrated in FIG. 4A and FIG. 4B, includes multiple light emitting devices 30, a circuit substrate 31 on which the light emitting devices 30 are disposed, and a waterproof member 32 provided on the circuit substrate 31 so as to cover the areas surrounding each of the light emitting devices 30. FIG. 4B illustrates a cross-sectional view parallel to YZ plane of the display unit 300 but the cross-section parallel to the XZ plane also has the same configuration as that of FIG. 4B.

The light emitting devices 30 are arranged in a matrix on the circuit substrate 31. Although not illustrated, the first lead frame 4 and the second lead frame 5 for each light emitting device 30, and anode wiring and cathode wiring formed on the circuit substrate 31, are mechanically and electrically connected together by soldering.

Also, the areas surrounding each of the light emitting devices 30 installed on the circuit substrate 31 and the surface of the circuit substrate 31 are covered by the waterproof member 32. The waterproof member 32 prevents moisture from adhering to the electrically connected portions of the circuit substrate 31 and the light emitting devices 30 as well as the first lead frame 4 and the second lead frame 5 that are exposed to the outer surface of the package 2 of the light emitting device 30. Thus, the video display device 500 (See FIG. 5), described further below, that is provided with the multiple display units 300 can also be used outdoors.

The waterproof member 32 is formed by applying a silicone resin paste to the circuit substrate 31. The waterproof member 32 is not limited to a particular material, as long as the material has waterproof characteristics, and may be, for example, a film that is adhered to the circuit substrate 31.

In FIG. 4A, the light emitting devices 30 are arranged in a four-by-four array, however, there is no particular limitation on the number of light emitting devices 30 that may be arranged. For example, the light emitting devices 30 may be arranged in a 16×16 matrix, or a 32 by 32 matrix. The distance between the light emitting devices 30 adjacent to each other on the circuit substrate 31 is, for example, 4 mm to 20 mm.

The direction in which the white surfaces 13a and 13b mutually oppose each other ($\eta$ direction in FIG. 1) in the individual light emitting devices 30 is referred to below as a first direction. Also, the direction in which the black surfaces 12a and 12b mutually oppose each other ($\xi$ direction in FIG. 1) is referred to as a second direction.

In each display unit 300, the aforementioned first direction ($\eta$ direction in FIG. 1) of all the light emitting devices 30 on the circuit substrate 31 is in the row direction (X direction in FIG. 4A and FIG. 4B) of the matrix made up of the arrangement positions of the light emitting devices 30 on the circuit substrate 31, and the aforementioned second direction ($\xi$ direction in FIG. 1) is in the column direction (Y direction in FIG. 4A and FIG. 4B).

Here, the row direction of the matrix means the lengthwise direction of one row in the matrix, whereas the column direction means the lengthwise direction of one column in the matrix.

Figure 5:
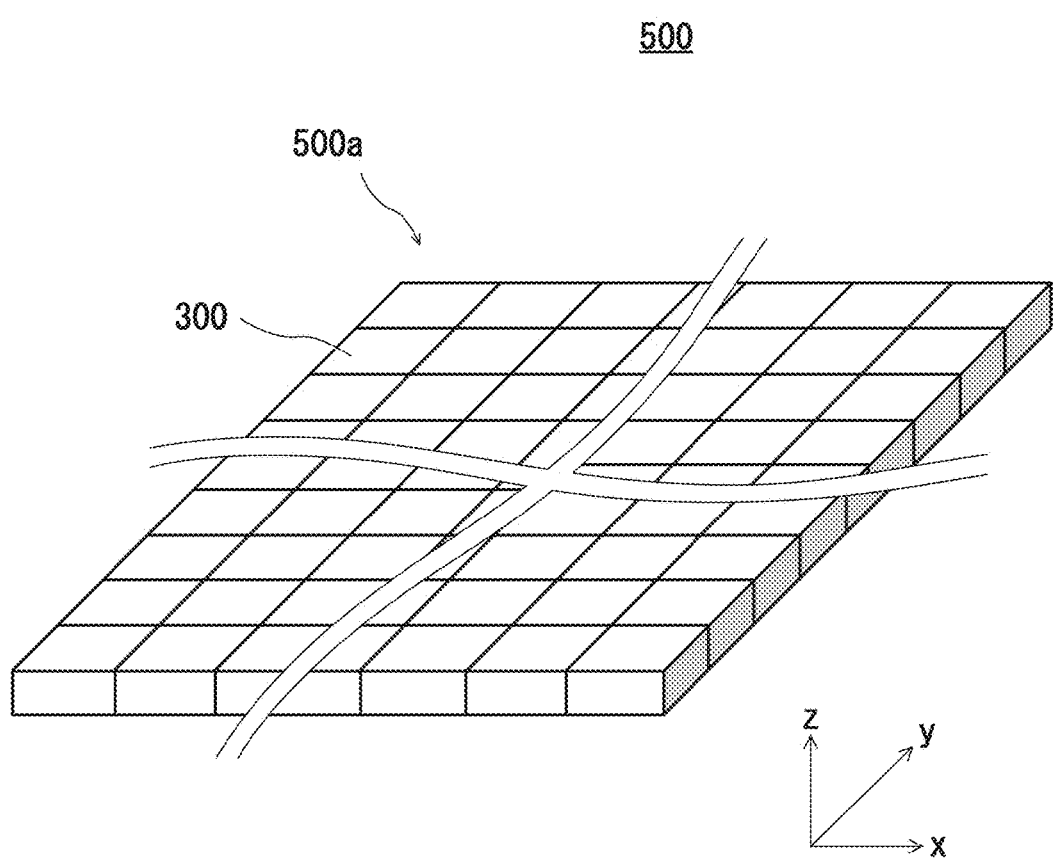
FIG. 5 is a perspective view of a video display device according to the embodiment.

As illustrated in FIG. 5, the video display device 500 that displays video is provided with multiple display units 300 that are planarly arranged in a matrix. These display units 300 as a whole make up a single display screen 500a. A display unit 300 that emits red light, a display unit 300 that emits green light, and a display unit 300 that emits blue light together form a single pixel of the display screen 500a. The display screen 500a includes a multitude of pixels, and can display color video. A single display unit 300 may include a light emitting device 30 that emits red light, a light emitting device 30 that emits green light, and a light emitting device 30 that emits blue light.

The video display device 500 includes the display units 300 arranged in the X direction and the Y direction of the XYZ orthogonal coordinate system also illustrated in FIG. 4A. That is, in the video display device 500, the aforementioned first direction ($\eta$ direction in FIG. 1) of the light emitting devices 30 in all the display units 300 is in the row direction (X direction in FIG. 5) of the matrix made up of the arrangement positions of the display units 300, and the aforementioned second direction ($\xi$ direction in FIG. 1) is in the column direction (Y direction in FIG. 5).

Thus, when the video display device 500 is installed such that the Y direction is the vertical direction (up-and-down direction) and the X direction is the horizontal direction (right-and-left direction), the black surfaces 12a and 12b illustrated in FIG. 1 face each other in the Y direction (up-and-down direction).

In such a case, in a plane (in the YZ plane in FIG. 5) defined by the normal (Z axis in FIG. 4A) and the Y axis of the circuit substrate 31, the outside light irradiating the light emitting device 30 from a diagonal direction incidents on the black surfaces 12a and 12b, and attenuates due to the black surfaces 12a and 12b. Thus, the outside light is unlikely to be reflected or scattered. Also, the outside light that irradiates the light emitting device 30 from the front incidents on the black bottom surface 10a of the concavity 2a, and since the light is attenuated by the bottom surface 10a, the light is unlikely to be reflected or scattered. As a result, even under circumstances in which there is exposure to outside light, the video display device 500 achieves contrast largely independent of the viewing angle within the YZ plane.

Conversely, the white surfaces 13a and 13b face each other in the X direction (right-and-left direction). In the light emitting devices 30, since the light emitted from the LED chip 1 reflects off the white surfaces 13a and 13b, with virtually no attenuation, and travels outward, loss of the light emitted by the LED chip 1 is unlikely. As a result, the video display device 500 achieves a high luminance. As described above, the video display device 500 achieves both a high luminance and a high contrast.

The above-described embodiment is one embodiment concerning the light emitting device, the display unit, and the video display device. The configurations of these can be modified, for example, as described below in (1) to (3).

Figure 6:
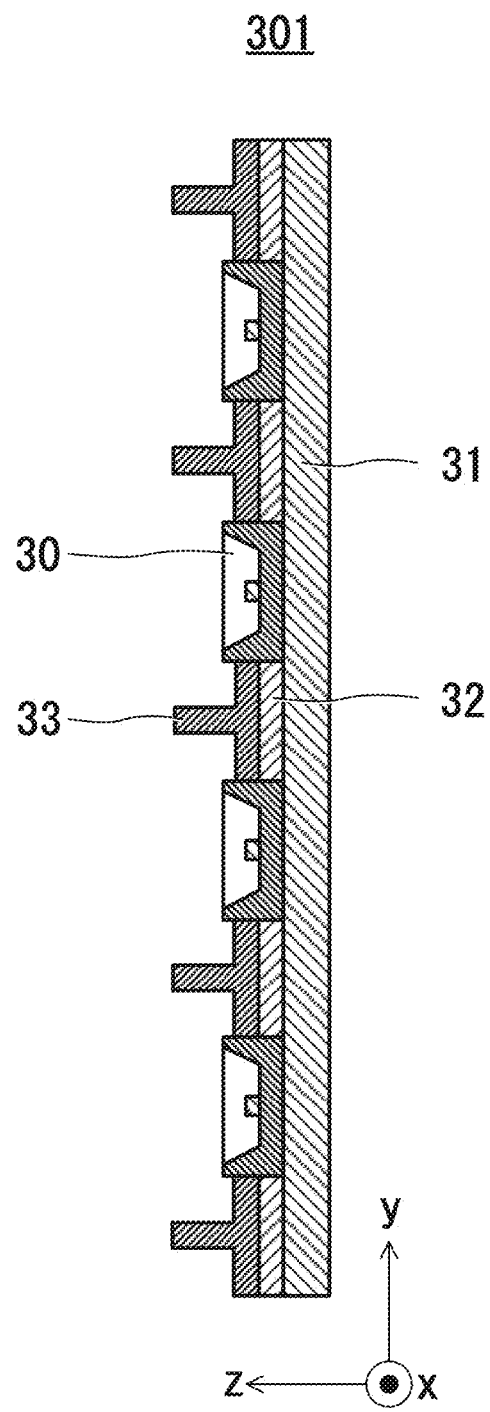
FIG. 6 is a cross-sectional view parallel to YZ plane of the display unit according to another embodiment.

(1) The display unit 301 may include a shader 33 as illustrated in FIG. 6. The shader 33 is disposed on the circuit substrate 31, and an eave-shaped portion of the shader 33, in between the adjacent light emitting devices 30, protrudes out further than the light emitting devices 30.

The shader 33 is formed of a polycarbonate resin with a carbon black additive, and is black. As long as the materials that make up the shader 33 are black, the materials are not especially limited.

The shaders 33, in planar view, are rectangular and surround the light emitting devices 30. Therefore, the shader 33 prevents reflecting and scattering of outside light with respect to the up-and-down direction and the right-and-left direction. As a result, favorable contrast is achieved regardless of the viewing angle.

The shader 33, in planar view, does not have to be rectangular, and may be, for example, of a shape that is convex extending in only the row direction (X direction).

Figure 7:
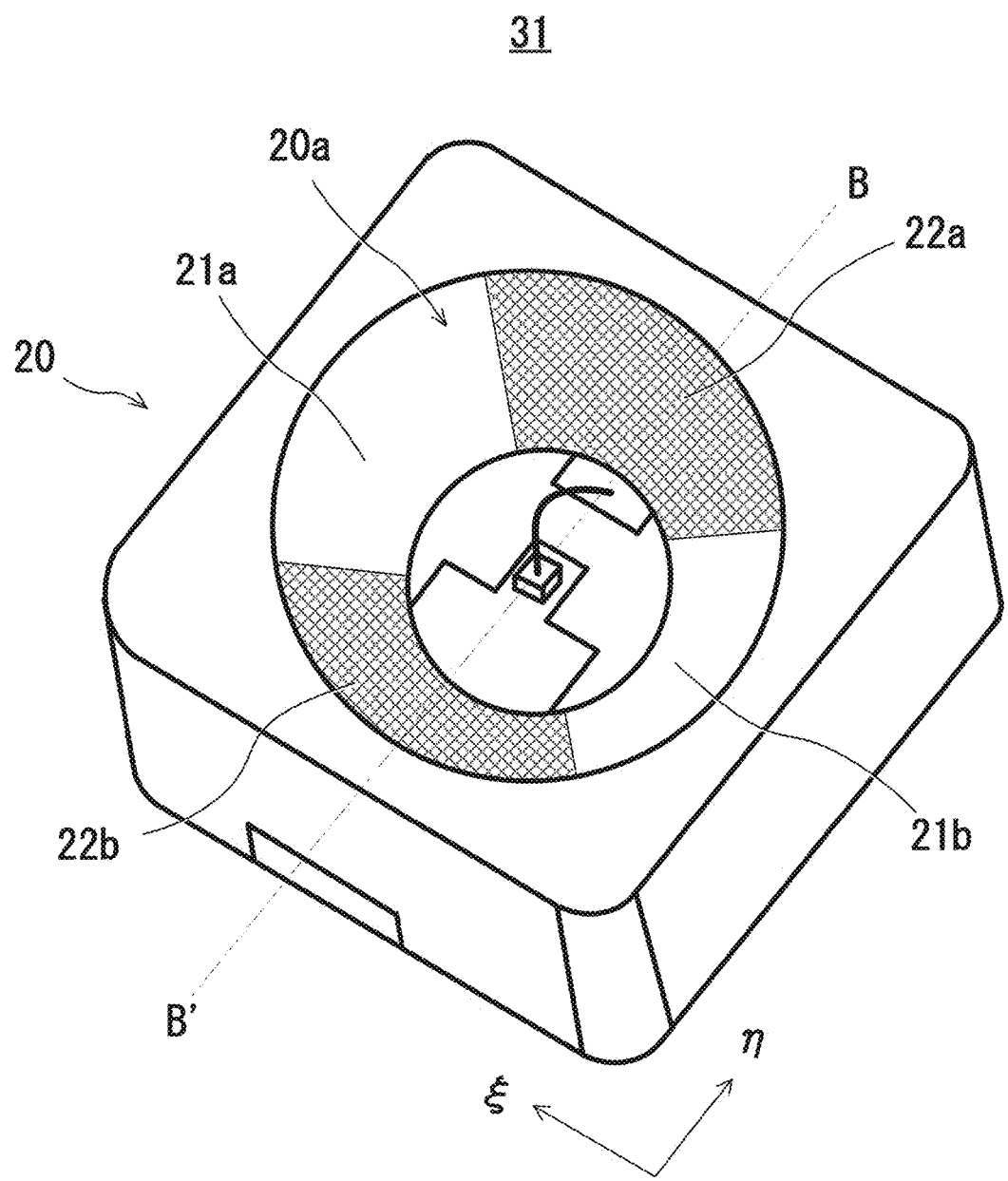
FIG. 7 is a perspective view of the light emitting device according to another embodiment.

(2) The shape of the concavity 2a of the package 2 is not especially limited to a truncated square pyramid. For example, as illustrated in FIG. 7, the shape of a concavity 20a of a package 20 may be a truncated conical pyramid.

The inner circumferential surface of the concavity 20a is demarcated into four substantially equal areas with respect to the circumferential direction. Two areas 21a and 21b that face each other in the ξ direction are formed in black, whereas two areas 22a and 22b that face each other in the η direction are formed in white.

Figure 8A:
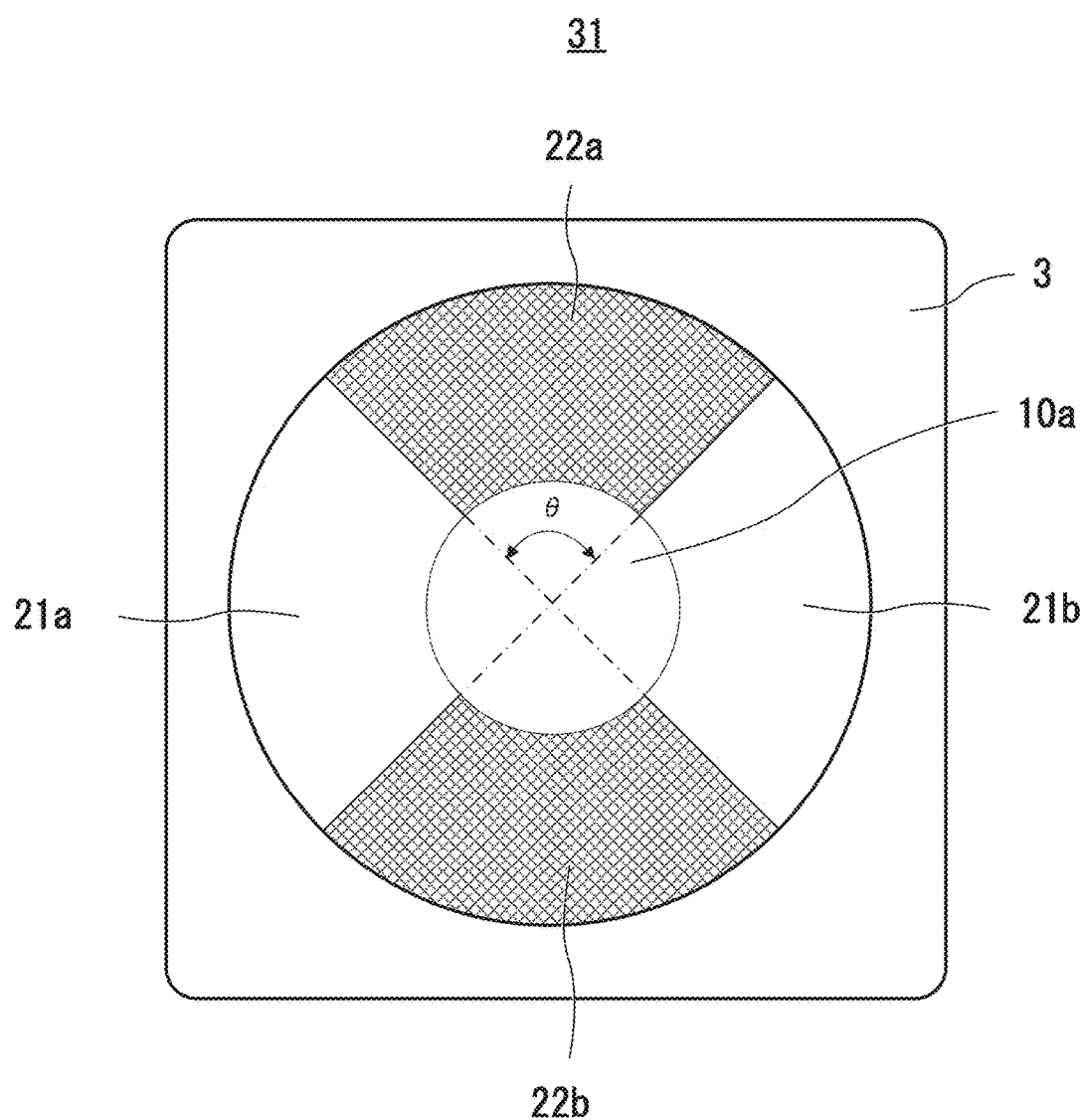
FIG. 8A is a plan view of the light emitting device illustrated in FIG. 7.

As illustrated in FIG. 8, in planar view of a light emitting device 31, the black areas 21a and 21b and the white areas 22a and 22b are defined by positions of imaginary lines passing through the center of the bottom surface 10a and intersecting at the angle of intersection θ. In the present embodiment, the bottom surface 10a and the opening of the concavity 20a are perfectly circular and the angle of intersection θ is 90 degrees. Thus, the surface area of the black areas 21a and 21b and the surface area of the white areas 22a and 22b are the same. To facilitate understanding, the lead frames 4 and 5, the bonding wire 6, and the LED chip 1 are not illustrated in FIG. 8A. This light emitting device 31 provides the same operation effect as the light emitting device of FIG. 1.

The shape, in planar view, of the bottom surface 10a and the opening of the concavity 20a is not limited to as described here. For example, the shape may be a polygon that is triangular or a polygon that has more sides than or equal to that of a pentagon.

Figure 8B:
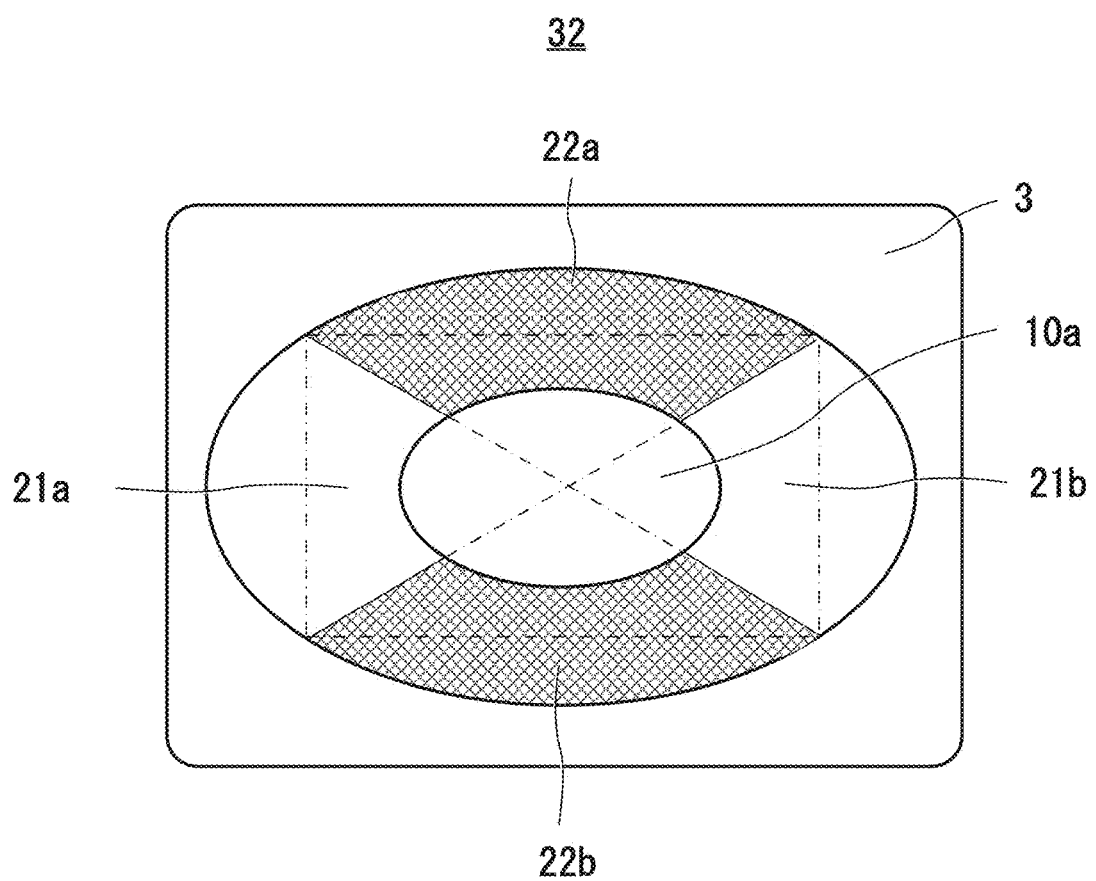
FIG. 8B is a plan view of the light emitting device according to yet another embodiment.

As illustrated in FIG. 8B, the bottom surface 10a and the opening of the concavity 20a may be elliptical in planar view. In planar view of this light emitting device 32, the black areas 21a and 21b and the white areas 22a and 22b are defined by positions of the diagonal lines of the imaginary rectangle inscribed in an ellipse that is the shape of the opening of the concavity 20a.

Figure 9:
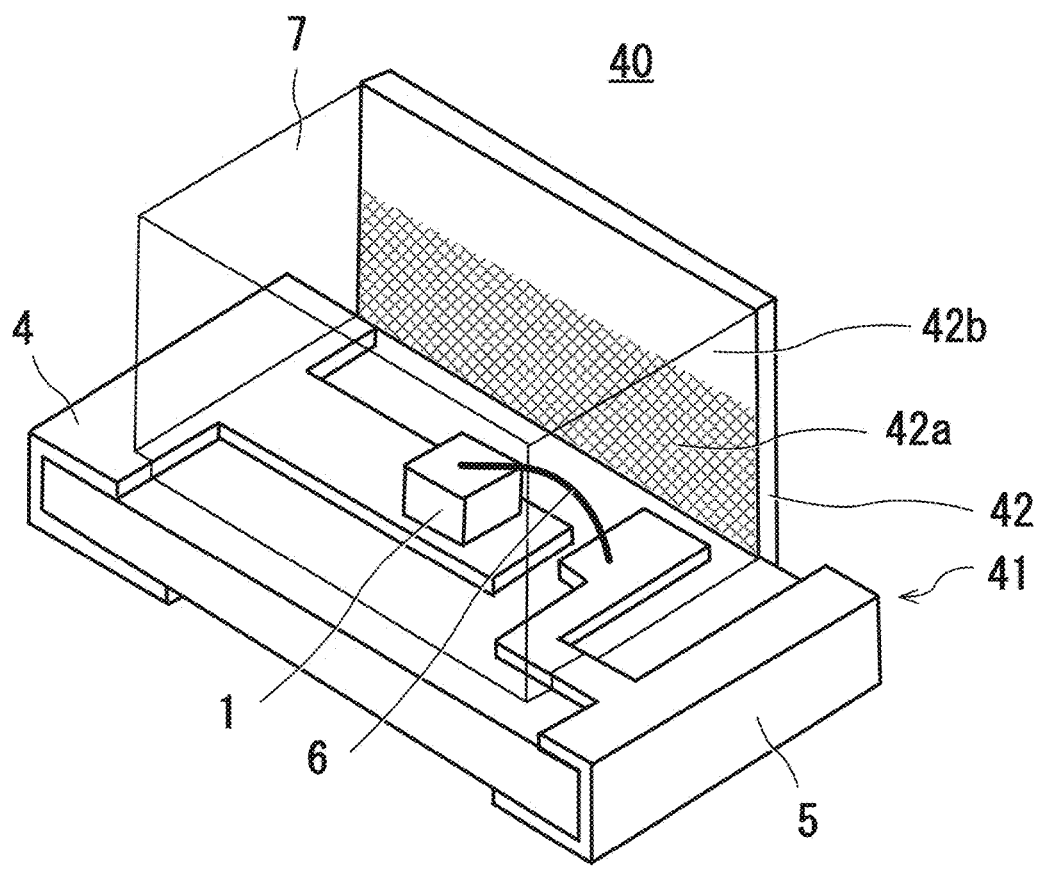
FIG. 9 is a perspective view of the light emitting device according to yet even another embodiment.

(3) An element substrate 41 mounted on a wall 42, as illustrated in FIG. 9, may be used in lieu of the package 2 formed with the concavity 2a. A light emitting device 40 includes the LED chip 1, the element substrate 41 having a surface on which the LED chip 1 is disposed, the wall 42 that stands substantially vertical from the element substrate 41 such that the wall 42 has an inner surface facing the LED chip 1, and the sealing member 7 that seals the LED chip 1 disposed on the element substrate 41.

The element substrate 41 includes the first lead frame 4 and the second lead frame 5, and a sheet-shaped body to which the first lead frame 4 and the second lead frame 5 are attached. The surface of the element substrate 41 is black. This is achieved by forming the sheet-shaped body of the element substrate 41 by using a black resin, and by applying black paint to surfaces of the first lead frame 4 and the second lead frame 5.

The inner surface of the wall 42 that faces the LED chip 1 includes a white area 42a that is white and a black area 42b that is black. Specifically, the inner surface of the wall 42 is divided into two sections with respect to the height direction of the wall 42, and the area closer to the LED chip 1 is the white area 42a, and the remaining area is black area 42b. Also, the entire rear surface of the wall 42 is black.

A production method of this light emitting device 40 is described. First, the element substrate 41 is formed by attaching the first lead frame 4 and the second lead frame 5 to the sheet-shaped body surface coated with black paint that has insulating properties. The wall 42 is formed separately by applying white paint to the area that is to be the white area 42a on one surface of black resin formed into a sheet.

Next, the LED chip 1 is attached to the element substrate 41, and the wall 42 is attached to a side surface of the substrate 41. Next, the LED chip 1 on the element substrate 41 is sealed with the sealing member 7. The light emitting device 40 is obtained through the aforementioned process.

Figure 10:
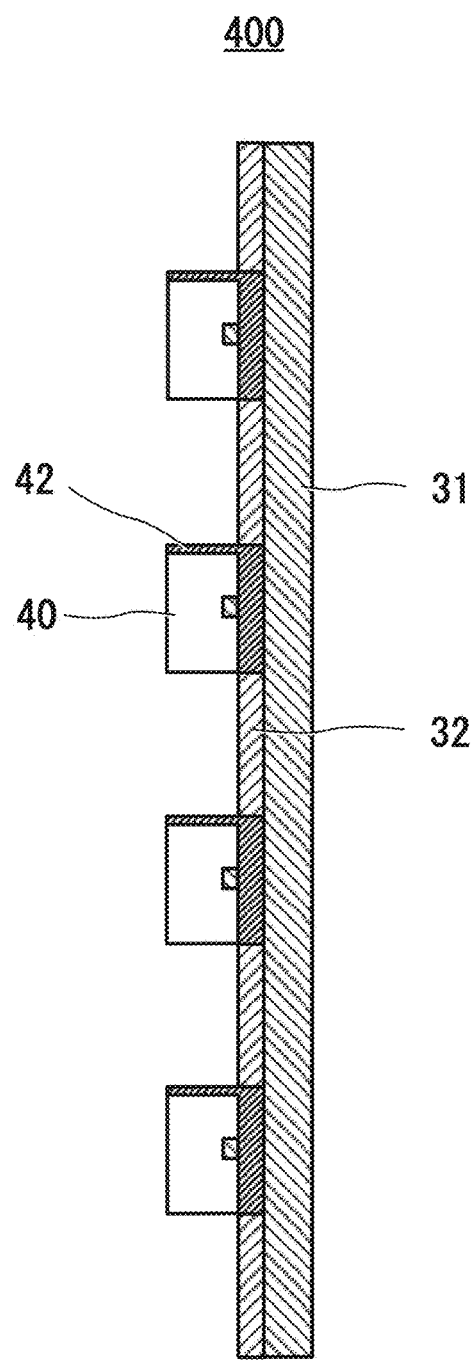
FIG. 10 is a cross-sectional view of the display unit according to yet even another embodiment.

For the display unit 400 including multiple light emitting devices 40 disposed on a circuit substrate as illustrated in FIG. 10, the black area 42b on the inner surface of the wall 42 of each light emitting device 40 and the black rear surface of the wall 42 serve as eaves to prevent outside light from reaching the element substrate 41. Also, the black surface of the element substrate 41 attenuates any outside light incident thereto, and thus suppresses reflection and scattering of the outside light. As a result, high contrast is achieved.

Also, since the white area 42a on the inner surface of the wall 42 serves as a reflector against light emitted from the LED chip 1, the illuminance is unlikely to be jeopardized. In this way, the light emitting device 40 achieves both a high luminance and a high contrast.

Figure 11:
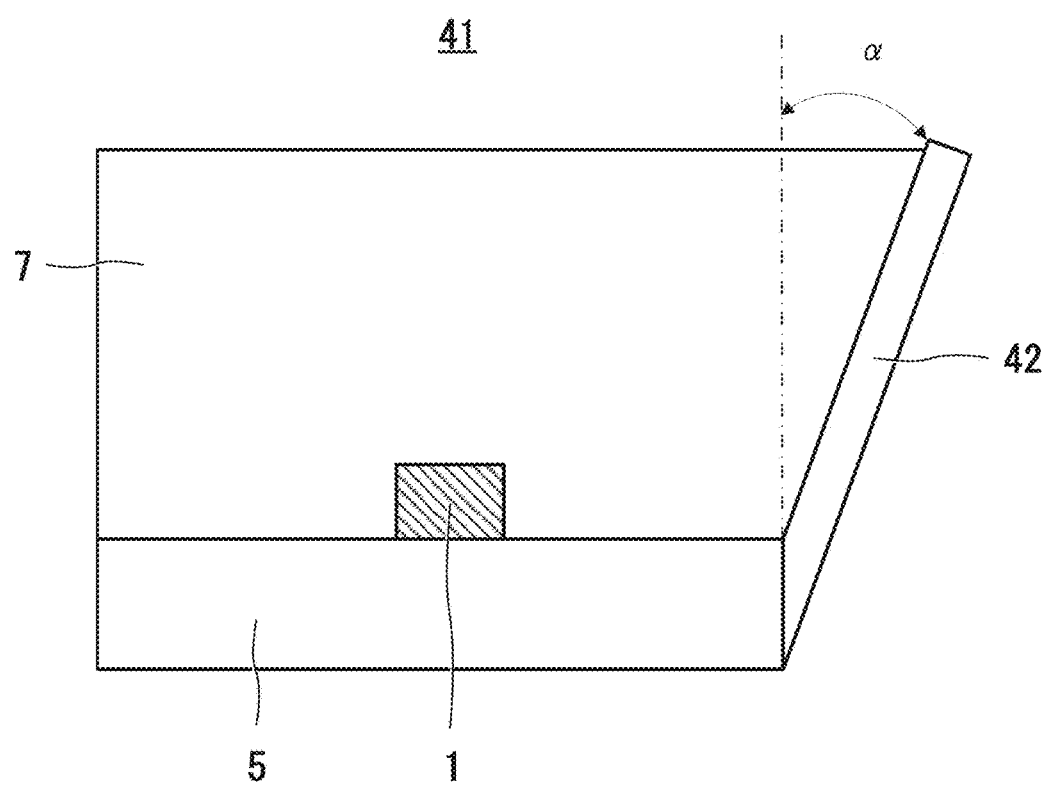
FIG. 11 is a right-side view of the light emitting device according to yet even another embodiment.

In FIG. 9, the wall 42 that stands substantially vertical from the element substrate 41 is illustrated as an example, but the wall 42 may be erected from the element substrate 41 in a slanted fashion. For example, the wall 42 may be erected such that the wall 42 slants outwardly along and toward the upper edge portion of the wall 42 as illustrated in the right-side view of FIG. 11. This achieves even greater illuminance because, among the light emitted by the LED chip 1, the component amount of light that travels in the normal direction of the element substrate 41 after being reflected by the white area 42a can be increased. The element substrate 41 in planar view is not limited to the square shape and may instead be polygonal, circular, or elliptical in shape.

Embodiments of the present disclosure are described above. However, the present disclosure is not restricted to those embodiments.

In the above-described embodiments, the inner surfaces 12a, 12b, 21a, and 21b of the concavity 2a, the bottom surface 10a of the concavity 2a, the inner surface area 42b of the wall 42, and the surface of the element substrate 41 are formed in black, but as long as the color is dark (including black), black is not necessary. The dark color refers to a color obtained by processing that causes reflectance against sunlight (hereinafter referred to simply as reflectance) and lightness to drop. For example, a dark color surface can be achieved by forming on the bottom layer a film containing a colorant having a reflectance and a lightness less than that of the bottom layer, or by forming an element substrate with a material obtained by adding to a base material a colorant having a reflectance and a lightness less than that of the base material. Specifically, in addition to black, examples of the dark color include gray, dark blue, dark brown, dark purple, navy, and deep green. The dark color may be achromatic or chromatic. Based on results from a vision test using the Munsell color chart system, preferably, the dark color has a lightness less than or equal to four, or more preferably a lightness less than or equal to two. Also, based on results of the vision test, preferable, the dark color has a reflectance that is less than or equal to 30%, or more preferably a reflectance less than or equal to 20%.

Here, examples of the dark colorant to achieve the dark color include amorphous carbon such as carbon black or inorganic oxides such as chromium oxide, manganese oxide, and iron oxide. Examples of the aforementioned base material or the film containing the dark colorant include resins such as epoxy resin, phenolic resin, polyimide resin, and polyphthalamide resin or ceramics such as aluminum oxide and aluminum nitride.

In the above-described embodiments, the inner surfaces 13a, 13b, 22a, and 22b of the concavity 2a and the inner surface area 42a of the wall 42 are formed in white, but as long as the color is light (including white), white is not necessary. The light color refers to a color obtained by processing that increases lightness. For example, a light color surface can be achieved by forming the element substrate with a material obtained by adding to a base material a colorant having a reflectance and a lightness greater than that of the base material or by forming on the bottom layer a film containing a colorant having lightness greater than that of the bottom layer. Specifically, other examples of light colors besides white include milky white, yellow, and silver. The light color may be achromatic or chromatic. Based on results from a vision test using the Munsell color chart system, preferably the light color has a lightness greater than or equal to six, or more preferably a lightness greater than or equal to eight.

Here, examples of the aforementioned light colorants to achieve the light color include titanium oxide, zinc oxide, and the like. As the base material or the film containing the light colorant, a similar base material or film containing the aforementioned dark colorant can be used.

Also, as long as the inner surfaces 13a and 13b of the concavity 2a, the inner surfaces 22a and 22b of the concavity 20a, and the inner surface white area 42a of the wall 42 have greater reflectance with respect to the light emitted from the LED chip 1 than that of the inner surfaces 12a, 12b, 21a, and 21b and the inner surface black area 42b, the inner surfaces 13a, 13b, 22a, and 22b and the inner surface white area 42a do not need to be formed in light color.

For example, the inner surfaces 13a, 13b, 22a, and 22b of the concavity 2a and the inner surface white area 42a of the wall 42 may be mirror surfaces. The mirror surface may be made of metal, for example. Specifically, the mirror surface may be formed from a thin metallic sheet of gold, silver, bronze, aluminum, nickel, or the like, or an alloy thereof. Also, the mirror surface can be formed by vapor deposition or plating of such metals. The mirror surface achieves a high reflectance with respect to light emitted from the LED chip 1.

In the above embodiments, a single light emitting device includes a single light emitting element, but the light emitting device may include, for example, three light emitting elements each corresponding to one of three primary colors, or may contain four or more light emitting elements. The sealing member 7 may include a fluorescent substance or filler, for example. Also, in order to improve contrast, the sealing member 7 may contain a dark colorant. Also, the optical device may be of substantially any size, and the size may be freely chosen to suit the pixel size of the video display unit, the size and number of light emitting elements, and the application and purpose. The display unit of the present disclosure is not limited to applications involving outdoor usage, and of course may be used indoors as well.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The light emitting device, the display unit, and the video display device of the present disclosure can be used for a display installed outdoors or indoors, for example.

REFERENCE SIGNS LIST

1 LED chip (light emitting element)
2, 20 Package (light emitting element holding member)
2a, 20a Concavity
3 Molded body
4, 5 Lead frame
6 Bonding wire
7 Sealing member
10 Sheet base (base)
10a Bottom surface
11, 42 Wall
11a, 11b Thin white sheet
12a, 12b Surface (first area)
13a, 13b Surface (second area)
21a, 21b First area
22a, 22b Second area
30, 40 Light emitting device
31 Circuit substrate
32 Waterproof member
33 Shader
41 Element substrate
42a White area
42b Black area
300, 301, 400 Display unit
500 Video display device
500a Display screen

The invention claimed is:

1. A light emitting device comprising:
at least one light emitting element to emit light; and
a light emitting element holding member that includes a base on which the light emitting element is disposed and a wall standing from the base such that the wall has an inner surface that faces the light emitting element, wherein the inner surface of the wall includes a first area extending from the base to an opposite terminal edge of the inner surface that is formed in a dark color, and a second area extending from the base to an opposite terminal edge of the inner surface having a reflectance that is greater than that of the first area with respect to the light emitted by the light emitting element,
wherein the wall stands from the base such that the wall includes an inner circumferential surface entirely surrounding the light emitting element disposed on the base, the first area defined by two areas mutually opposing each other within the inner circumferential surface of the wall, and the second area being defined by two areas that each separate the two first areas and are mutually opposing each other in a direction intersecting with a direction in which the two areas of the first area mutually oppose each other within the inner circumferential surface of the wall.

2. The light emitting device according to claim 1 wherein the second area includes at least an area formed in white or an area formed as a mirror surface.

3. The light emitting device according to claim 1, wherein the dark color is black.

4. The light emitting device according to claim 1, wherein a surface area of the first area is equal to a surface area of the second area.

5. A display unit comprising:
light emitting devices; and
a circuit substrate on which the light emitting devices are arranged in a matrix,
wherein the light emitting devices each comprise:
at least one light emitting element to emit light; and
a light emitting element holding member that includes a base on which the light emitting element is disposed and a wall standing from the base such that the wall has an inner surface that faces the light emitting element wherein the inner surface of the wall includes a first area extending from the base to an opposite terminal edge of the inner surface that is formed in a dark color, and a second area extending from the base to an opposite terminal edge of the inner surface having a reflectance that is greater than that of the first area with respect to the light emitted by the light emitting element,
wherein the wall stands from the base such that the wall includes an inner circumferential surface entirely surrounding the light emitting element disposed on the base, the first area defined by two areas mutually opposing each other within the inner circumferential surface of the wall, and the second area being defined by two areas that each separate the two first areas and are mutually opposing each other in a direction intersecting with a direction in which the two areas of the first area mutually oppose each other within the inner circumferential surface of the wall.

6. The display unit according to claim 5,
wherein the second direction is substantially orthogonal to the first direction within the inner circumferential surface of the wall, and
for all the light emitting devices, the first direction on the circuit substrate is either one of a row direction and a column direction of the matrix, and the second direction is the other one of the row direction and the column direction.

7. A video display device comprising:
display units according to claim 5 arranged in a matrix, wherein the display units form a display screen to display video.

8. The video display device according to claim 7,
wherein the second direction is substantially orthogonal to the first direction within the inner circumferential surface of the wall, and
wherein the display units are each configured such that the first direction in all the light emitting devices on the circuit substrate is either one of a row direction and a column direction of the matrix, and the second direction in all the light emitting devices on the circuit substrate is the other one of the row direction and the column direction.

9. The video display device according to claim 8, wherein the first direction in the light emitting devices in all the display units is either one of the row direction and the column direction of the matrix defined by the arrangement positions of the display units, and the second direction is the other one of the row direction and the column direction, wherein the row direction and the column direction of the matrix are defined by the arrangement positions of the display units.

* * * * *